United States Patent
Terzioglu et al.

(10) Patent No.: US 8,605,536 B2
(45) Date of Patent: Dec. 10, 2013

(54) POWER-ON-RESET (POR) CIRCUITS FOR RESETTING MEMORY DEVICES, AND RELATED CIRCUITS, SYSTEMS, AND METHODS

(75) Inventors: Esin Terzioglu, San Diego, CA (US); Balachander Ganesan, San Diego, CA (US); Alex Dongkyu Park, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 108 days.

(21) Appl. No.: 13/460,862

(22) Filed: May 1, 2012

(65) Prior Publication Data

US 2013/0208556 A1 Aug. 15, 2013

Related U.S. Application Data

(60) Provisional application No. 61/598,096, filed on Feb. 13, 2012.

(51) Int. Cl.
*G11C 8/00* (2006.01)

(52) U.S. Cl.
USPC ............... 365/230.06; 365/191; 365/233.1

(58) Field of Classification Search
USPC .................... 365/191, 230.06, 233.1
See application file for complete search history.

(56) References Cited

U.S. PATENT DOCUMENTS

| | | | |
|---|---|---|---|
| 5,477,176 A | 12/1995 | Chang et al. | |
| 6,181,635 B1 | 1/2001 | Bae | |
| 7,848,170 B2 | 12/2010 | Sugiura | |
| 2009/0122624 A1* | 5/2009 | Nishida | 365/200 |
| 2010/0246280 A1 | 9/2010 | Kanda | |
| 2011/0241741 A1 | 10/2011 | Millendorf et al. | |

OTHER PUBLICATIONS

International Search Report and Written Opinion—PCT/US2013/025607—ISA/EPO—May 22, 2013.

* cited by examiner

*Primary Examiner* — Hoai V Ho
(74) *Attorney, Agent, or Firm* — Nicholas J. Pauley; Peter Michael Kamarchik; Joseph Agusta

(57) ABSTRACT

Power-on-reset (POR) circuits for resetting memory devices, and related circuits, systems, and methods are disclosed. In one embodiment, a POR circuit is provided. The POR circuit is configured to receive as input, a plurality of decoded address outputs from at least one memory decoding device. The POR circuit is further configured to generate a POR reset if any of the plurality of decoded address outputs are active. As a result, memory decoding device latches can be reset to a known, default condition to avoid causing an unintentional word line selection in the memory during power-on state before an external reset is available. Because the POR circuit can generate the POR reset without need of an external reset, the memory decoding devices can be reset quickly to allow for quicker availability of memory after a power-on condition.

29 Claims, 9 Drawing Sheets

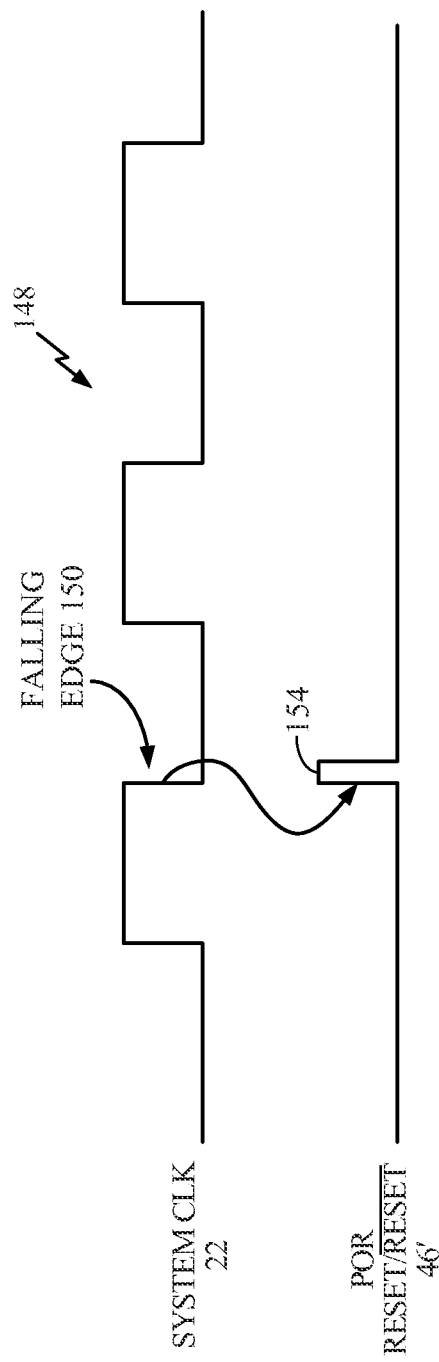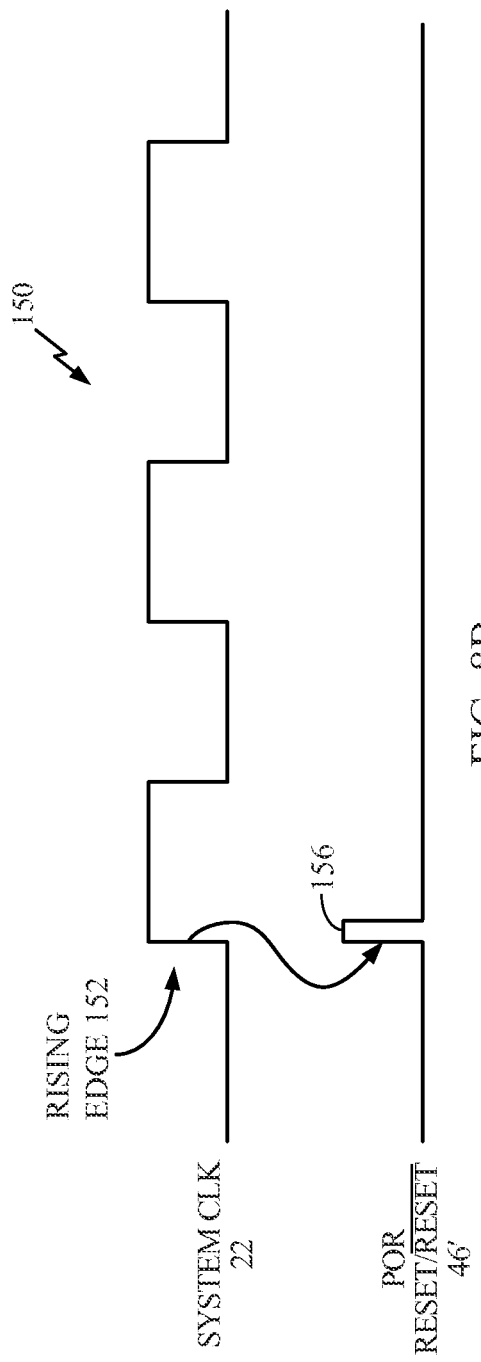

US 8,605,536 B2

POWER-ON-RESET (POR) CIRCUITS FOR RESETTING MEMORY DEVICES, AND RELATED CIRCUITS, SYSTEMS, AND METHODS

PRIORITY APPLICATION

The present application claims priority to U.S. Provisional Patent Application Ser. No. 61/598,096 filed on Feb. 13, 2012 and entitled "INTERNALLY GENERATED POWER-ON-RESET (POR) FOR RESETTING MEMORY DECODER LATCHES, AND RELATED CIRCUITS, SYSTEMS, AND METHODS," which is hereby incorporated herein by reference in its entirety.

BACKGROUND

I. Field of the Disclosure

The technology of the disclosure relates generally to handling of power-on conditions for memory devices, including for memory pre-decoding devices.

II. Background

In high speed memories, multiple pulsed latches are used to store decoded address values. These pulsed latches may be employed in memory decoding devices for a memory, such as memory pre-decoders and memory decoders. In the example of memory pre-decoders, the pulsed latches are configured to receive and store a portion of a memory address to be pre-decoded. The memory pre-decoder is configured to activate one of a plurality of pre-decoded address outputs provided to a memory decoder to select the memory word line corresponding to the memory address.

Following power-on of a device employing pulsed latch memory, the state of the pulsed latches is an unknown condition. Thus, to avoid unintentional selection of a random word line in the memory according to unknown states of the pulsed latches, the memory system is designed to prevent access before the pulsed latches are reset to a known default condition. As one example, an external reset signal generated after a power-on condition, (e.g., a system reset signal), may be provided to reset the pulsed latches. However, the external reset signal may be controlled by central processing unit (CPU) software or other system circuitry outside the memory system that is not quickly available after power-on. Therefore, valid memory accesses may not available during this time, thus increasing the time for power-on readiness of a device. If memory accesses were made available before an external reset signal becomes available, the unknown state of the pulsed latches could cause a random memory word line to be selected based on the random, unknown state of the pulsed latches. As an example, this could cause a run-time error to occur if a CPU attempts to execute an instruction at a word line in memory selected by pulsed latches in an unknown state.

SUMMARY OF THE DISCLOSURE

Embodiments disclosed in the detailed description include power-on-reset (POR) circuits for resetting memory decoding devices, and related systems and methods. It may be desired to provide a POR reset of memory decoding devices (e.g., memory pre-decoder latches or memory decoder latches) that is independent of an external reset provided by a CPU system or a CPU core, as an example. In this manner, the memory decoding device latches can be reset to a known, default condition to avoid causing an unintentional word line selection in the memory during a power-on state before an external reset is available. The memory decoding devices can be reset quickly upon power-up to a default condition to avoid causing an unintentional word line selection in the memory after power-on.

In one embodiment, a power-on-reset (POR) circuit is provided. The POR circuit is utilized for resetting at least one memory decoding device as a result of a power-on condition. The POR circuit is configured to receive as input, a plurality of decoded address outputs from at least one memory decoding device. The POR circuit is further configured to generate a POR reset if any of the plurality of decoded address outputs are active. Because the POR circuit can generate the POR reset without need of an external reset signal, the memory decoding device can be reset quickly to allow for quicker availability of memory after a power-on condition.

In another embodiment, a memory system is provided. The memory system comprises at least one memory decoding device. The at least one memory decoding device is configured to store at least a portion of a memory address. The at least one memory decoding device is further configured to generate a plurality of decoded address outputs from a plurality of memory decoding device latches. The at least one memory decoding device is further configured to receive a reset input to reset all of the plurality of decoded address outputs to an inactive state. The memory system further comprises a POR circuit. The POR circuit is configured to receive as input, the plurality of decoded address outputs from the plurality of memory decoding device latches. The POR circuit is further configured to generate a POR reset to provide the reset input if any of the plurality of decoded address outputs are active.

In another embodiment, a method of resetting a memory decoding device as a result of a power-on condition is provided. The method comprises receiving as input, a plurality of decoded address outputs from at least one memory decoding device. The method further comprises generating a POR reset if any of the plurality of decoded address outputs are active.

In another embodiment, a non-transitory computer-readable medium is provided. The computer-readable medium has stored thereon computer-executable instructions to cause a processor to implement a method for resetting a memory decoding device as a result of a power-on condition. The method comprises receiving as input, a plurality of decoded address outputs from at least one memory decoding device. The method further comprises generating a POR reset if any of the plurality of decoded address outputs are active.

BRIEF DESCRIPTION OF THE FIGURES

FIG. 8A is a timing diagram illustrating a POR reset signal generated based on a rising edge of a clock;

FIG. 8B is a timing diagram illustrating a POR reset signal generated based on a rising and/or falling edge of a clock.

DETAILED DESCRIPTION

Figure 1:
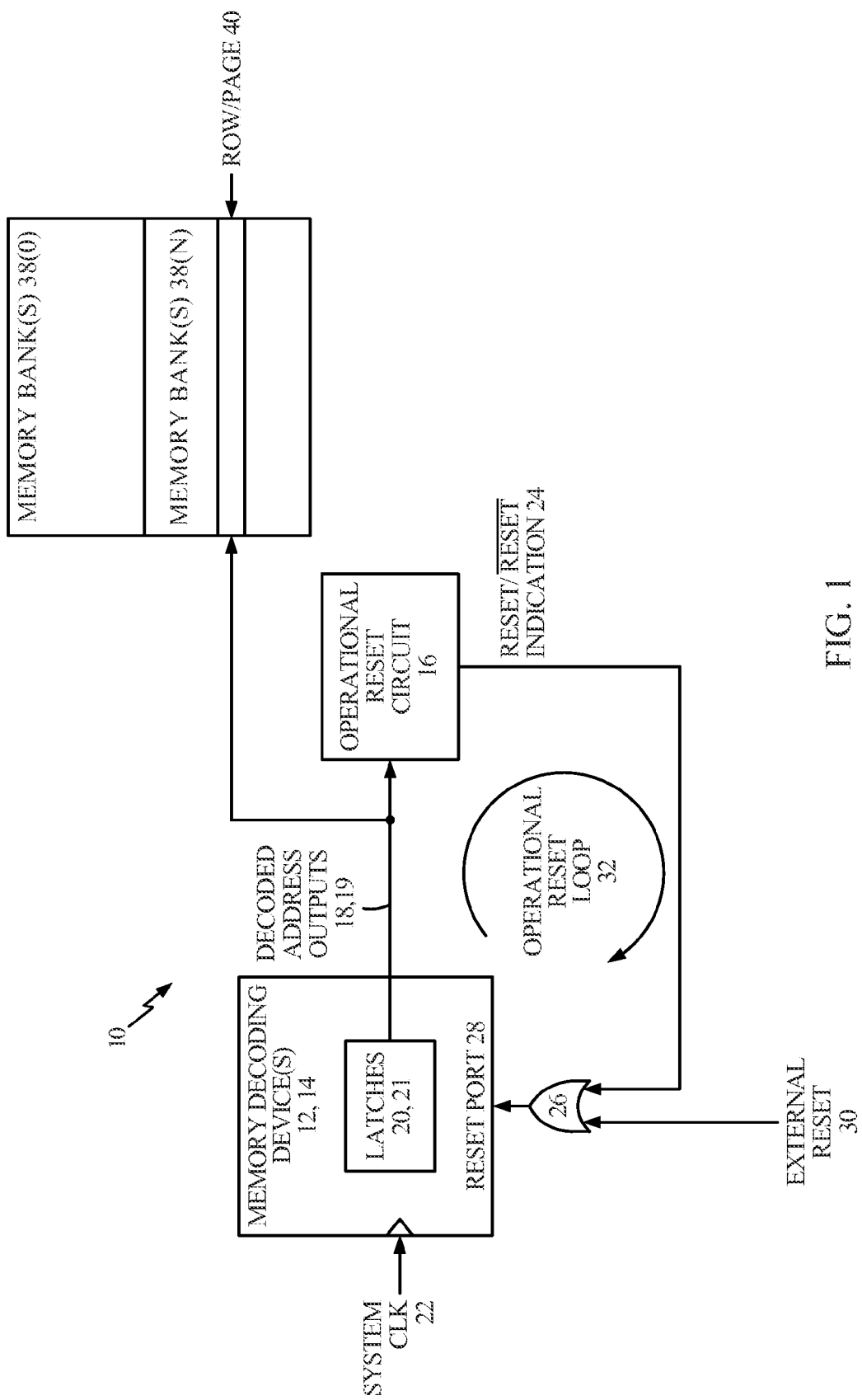
FIG. 1 is a block diagram of an exemplary memory system not including a POR circuit.

Embodiments disclosed in the detailed description include power-on-reset (POR) circuits for resetting memory decoding devices, and related systems and methods. It may be desired to provide a POR reset of memory decoding devices (e.g., memory pre-decoder latches or memory decoder latches) that is independent of an external reset provided by a CPU system or a CPU core, as an example. In this manner, the memory decoding device latches can be reset to a known, default condition to avoid causing an unintentional word line selection in the memory during a power-on state before an external reset is available. The memory decoding devices can be reset quickly upon power-up to a default condition to avoid causing an unintentional word line selection in the memory after power-on.

In one embodiment, a power-on-reset (POR) circuit is provided. The POR circuit is utilized for resetting at least one memory decoding device as a result of a power-on condition. The POR circuit is configured to receive as input, a plurality of decoded address outputs from at least one memory decoding device. The POR circuit is further configured to generate a POR reset if any of the plurality of decoded address outputs are active. Because the POR circuit can generate the POR reset without need of an external reset signal, the memory decoding devices can be reset quickly to allow for quicker availability of memory after a power-on condition.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

FIG. 1 illustrates a memory system 10 comprising memory decoding device(s) 12 and an operational reset circuit 16 configured to receive decoded address outputs 18, 19 from latches 20, 21 of the memory decoding device(s) 12. The memory decoding device(s) 12 may be memory decoders 12 (comprising latches 20 generating decoded address outputs 18) and/or memory pre-decoding devices 14, such as memory pre-decoders (comprising latches 21 generating decoded address outputs 19). When the memory system 10 is operational (i.e., after the memory system 10 has powered on and the system clock 22 has begun oscillating), an operational reset circuit 16 is configured to detect valid and invalid states of the memory decoding device(s) 12 based on the decoded address outputs 18, 19. Upon detecting an invalid state of the decoded address outputs 18, 19 during operation of the memory system 10, the operational reset circuit 16 provides a reset indication 24 to reset the memory decoding device(s) 12.

As illustrated in FIG. 1, the reset indication 24 may be provided to OR-based logic 26 to a reset port 28 of the memory decoding device(s) 12, 14 in order to reset the latches 20, 21 of the memory decoding device(s) 12, 14. The OR-based logic 26 may also receive an external reset 30 to reset the memory decoding device(s) 12, 14. Thus, the memory system 10 provides an operational reset loop 32 for resetting the memory decoding device(s) 12, 14 once the memory system 10 has begun operational mode.

However, the memory system 10 may encounter problems in a power-on mode (i.e., following power-on and before the operational mode of the memory system 10 has begun). When the memory system 10 is powered on, the initial state of the latches 20, 21 is unknown. Some of the latches 20, 21 may power-up in an active state; other latches of the latches 20, 21 may power-up in an inactive state. Though the memory system 10 is powered on, the memory system 10 is not yet operational. Therefore, the operational reset circuit 16 is not operable to detect invalid states of the latches 20, 21.

The unknown state of the latches 21 of the memory pre-decoding devices 14 may cause undesirable power spikes and/or current drain. In this regard, when the latches 21 of the memory pre-decoding devices 14 are active, the active latches 21 select memory banks 38 of the memory system 10. The memory pre-decoding device 14 should select only one memory bank 38. However, in power-on mode (i.e., after power-on and before operational mode has begun), the latches 21 each begin in an unknown state, which may be active or inactive. As a result, more than one of the latches 21 may be active after power-on and before the operational mode has begun. Thus, multiple selected memory banks 38(0)-38(N) may draw current. As a result, the memory system 10 may experience a power spike (i.e., a large current drain) after power-on and before the operational mode has begun. This may cause circuits of the memory system 10 to experience a higher current than a maximum current rating for which those circuits were designed.

The unknown state of the latches 20 of the memory decoding devices 12 may cause unintentional access (e.g., one or more reads and/or writes) to certain memory rows/pages 40 during the power-on mode (i.e., after power-on and before operational mode has begun). When the latches 20 are initially powered on, the latches 20 are also in an initially unknown state which may be active or inactive. Thus, during power-on mode, the initial state of the latches 20 may select one or more rows/pages 40 for access, which is undesirable. As a result, the rows/pages 40 that are selected by the latches 20 may be unintentionally read from or written to, based on the initially unknown state of the latches 20.

Figure 2:
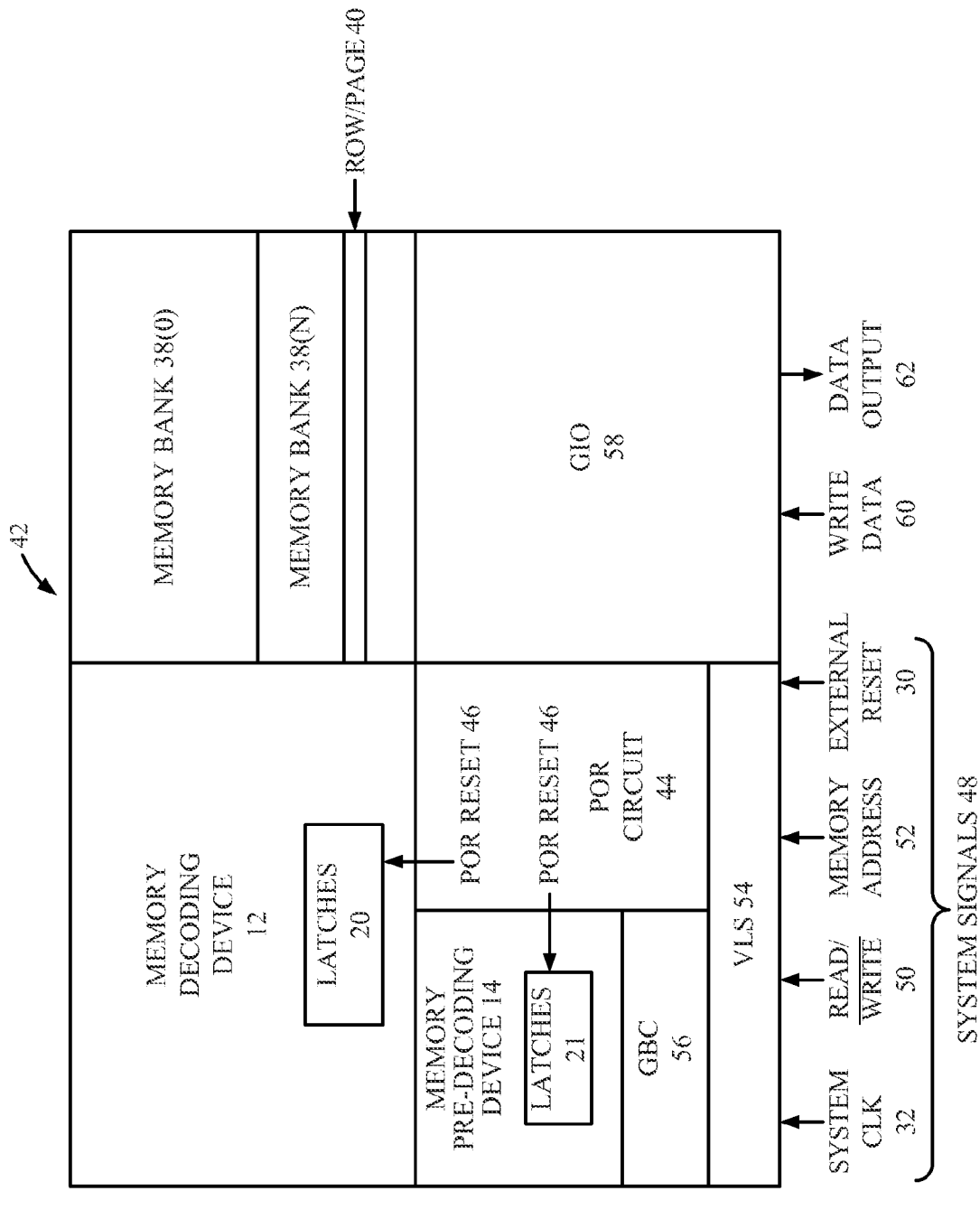
FIG. 2 is a block diagram of an exemplary memory system that includes a POR circuit configured to receive a plurality of decoded address outputs from a memory decoding device(s) and generating a POR reset if any of the plurality of decoded address outputs are active.
Figure 3:
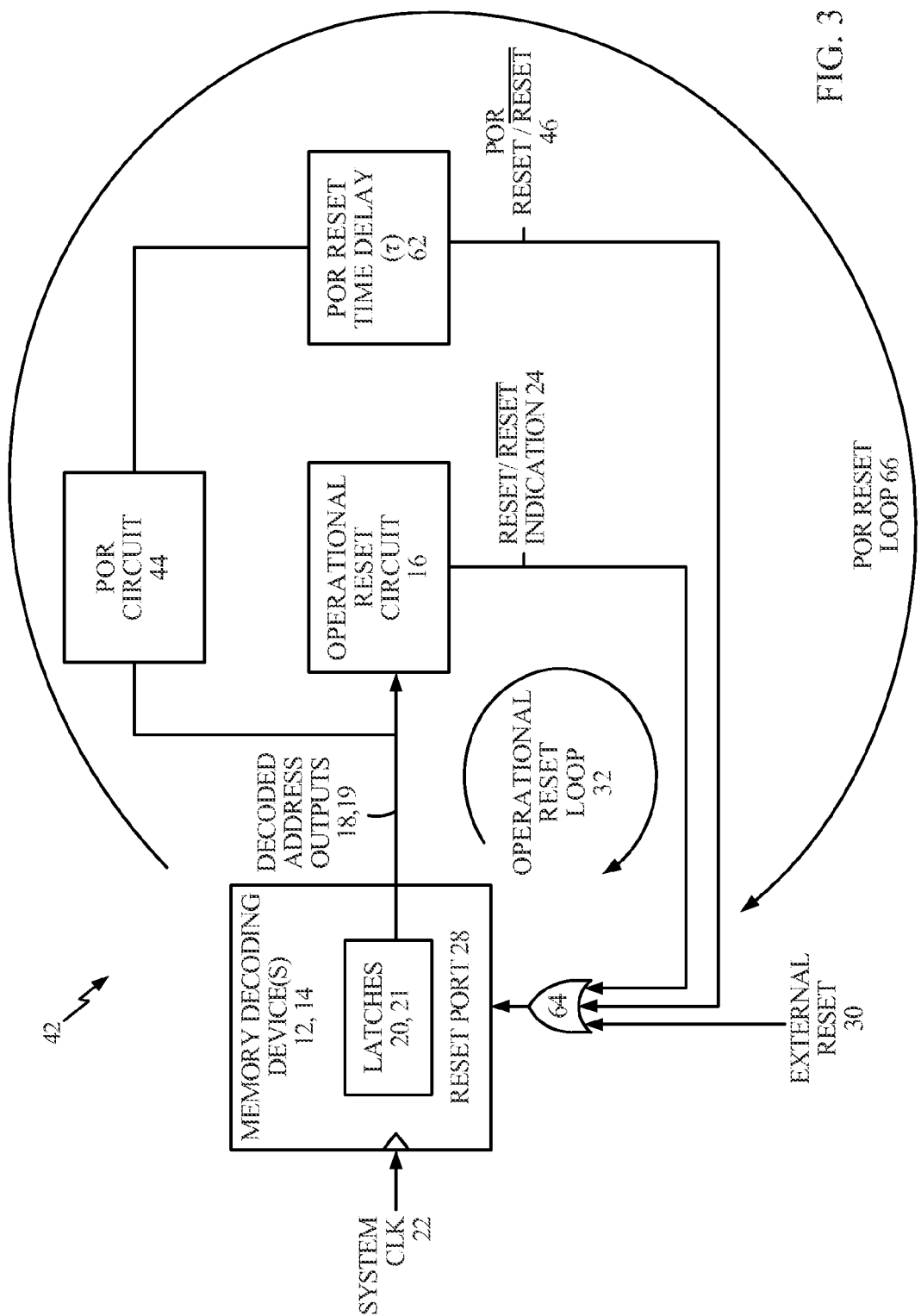
FIG. 3 is block diagram of another exemplary memory system having a POR circuit configured to receive a plurality of decoded address outputs from a memory decoding device (s) and generating a POR reset if any of the plurality of decoded address outputs are active.

To address these issues, FIGS. 2 and 3 provide a memory system 42 comprising a power-on-reset (POR) circuit 44. The POR circuit 44 receives the decoded address outputs 18, 19 from the latches 20, 21 of the memory decoding device(s) 12, 14. After power-on and before operational mode has begun, the POR circuit 44 is configured to generate a POR reset 46 if any of the decoded address outputs 18, 19 are active.

FIG. 2 is a block diagram of an exemplary memory system 42 comprising an exemplary power-on-reset (POR) circuit 44. Before discussing the details regarding the exemplary POR circuit 44, the other components of the memory system 42 are first described. In this regard, the memory system 42 includes a plurality of memory banks 38(0)-38(N). The memory system 42 receives external system signals 48. The system signals 48 include a system clock (SYSTEM CLK)

32, a read/write indication 50, a memory address 52, and an external reset 30. As a non-limiting example, the external reset 30 may be a system reset. The read/write indication 50 indicates whether the memory specified at the memory address 52 should be read or written. The memory system 42 may use the system clock 32 to clock the beginning and/or ending of a memory operation. The external reset 30 is a system signal 48 which may be used to reset the memory system 42.

With continuing reference to FIG. 2, when the memory system 42 is a low voltage memory system, the system signals 48 may be received by a voltage level shifter (VLS) 54. The VLS 54 shifts the voltage of the received system signals 48 to the lower voltages used by the memory system 42 for use in the internal circuitry of the memory system 42. The memory system 42 also comprises a global bank controller (GBC) 56. The GBC 56 receives the system signals 48 and uses the system signals 48 to control the memory banks 38(0)-38(N) of the memory system 42. In order to enable and/or power a memory bank 38, which is desired to be accessed, the GBC 56 provides the memory address 52 to a memory pre-decoding device 14 that pre-decodes the memory address 52 to enable and/or power the desired memory bank 38 for access.

The memory pre-decoding device 14 may also be used to select the memory bank 38 of the memory system 42. In this regard, the memory pre-decoding device 14 may provide a bank select for selecting the memory bank 38 of the memory system 42. The memory address 52 is also provided to a memory decoding device 12. The memory decoding device 12 selects a row/page 40 of the memory bank 38 that was selected by the memory pre-decoding device 14 for access. The memory decoding device 12 and/or the memory pre-decoding device 14 comprise latches 20, 21, that may be pulsed latches as an example. The latches 21 of the memory pre-decoding device 14 latch portions of the memory address 52. The memory decoding device 12 also comprises the latches 20 for latching portions of the memory address 52, that also may be pulsed latches.

With continuing reference to FIG. 2, the memory system 42 also comprises global input/output (GIO) circuitry 58. The GIO 58 receives write data 60 and outputs data output 62. If the read/write indication 50 indicates that the row/page 40 (accessed using the memory address 52) should be written, the data received on the write data 60 is written to the accessed memory location of the selected memory bank 38. If the read/write indication 50 indicates that the accessed memory location should be read, the data of the accessed memory location from the selected memory bank 38 is provided as the data output 62.

The memory system 42 illustrated in FIG. 2 and FIG. 3 also comprises the POR circuit 44. In this embodiment, the POR circuit 44 is provided to reset the latches 21 of the memory pre-decoding device 14 and/or the latches 20 of the memory decoding device 12, as a result of a power-on condition. The POR circuit 44 is configured to receive as input, a plurality of decoded address outputs 18, 19 from the memory pre-decoding device 14 and/or the memory decoding device 12. The POR circuit 44 is further configured to generate a POR reset 46 if any of the plurality of decoded address outputs 18, 19 are active.

The POR reset 46 generated by the POR circuit 44 is an internally-generated indicator (i.e. an indicator generated internal to the memory system 42). As discussed herein, "internal" means not being provided externally from outside the memory system 42. Because the POR circuit 44 can generate the POR reset 46 without need of the external reset 30, the memory decoding devices 12, 14 can be reset quickly to allow for quicker availability of memory in the memory banks 38 after a power-on condition.

With reference now to FIG. 3, the POR circuit 44 may delay the POR reset 46 by a POR reset time delay ($\tau$) 62. The POR reset time delay ($\tau$) 62 is provided between the POR circuit 44 and the reset port 28 so that the POR reset 46 is delayed until after the power supply voltage (Vdd) 68 (see FIG. 4) becomes stable and before the memory decoder latches 20, 21 and the memory banks 38 (as a non-limiting example, SRAM memory banks) are accessed. The POR reset time delay ($\tau$) 62 may also be provided to avoid interrupting an operational reset indication 24 generated from the operational reset circuit 16. Note that the operational reset circuit 16 and external reset 30 are still provided, but are independent of the POR circuit 44. In other words, the POR circuit 44 can reset the memory decoder latches 20, 21 independently of the operational reset circuit 16 and the external reset 30.

The POR reset 46 may be provided to OR-based logic 64 (along with the external reset 30 and the reset indication 24 from the operational reset circuit 16) to the reset port 28 of the memory decoding device(s) 12, 14 to reset the latches 20, 21. As a result, the POR circuit 44 provides a POR reset loop 66 for resetting the state of all the latches 20, 21 to an inactive state after power-on and before operational mode has begun. As a result, power consumption is reduced after power-on and before the operational mode has begun. As a further result, unintentional access(es) of the rows/pages 40 of the memory system 42 may be avoided.

Figure 4:
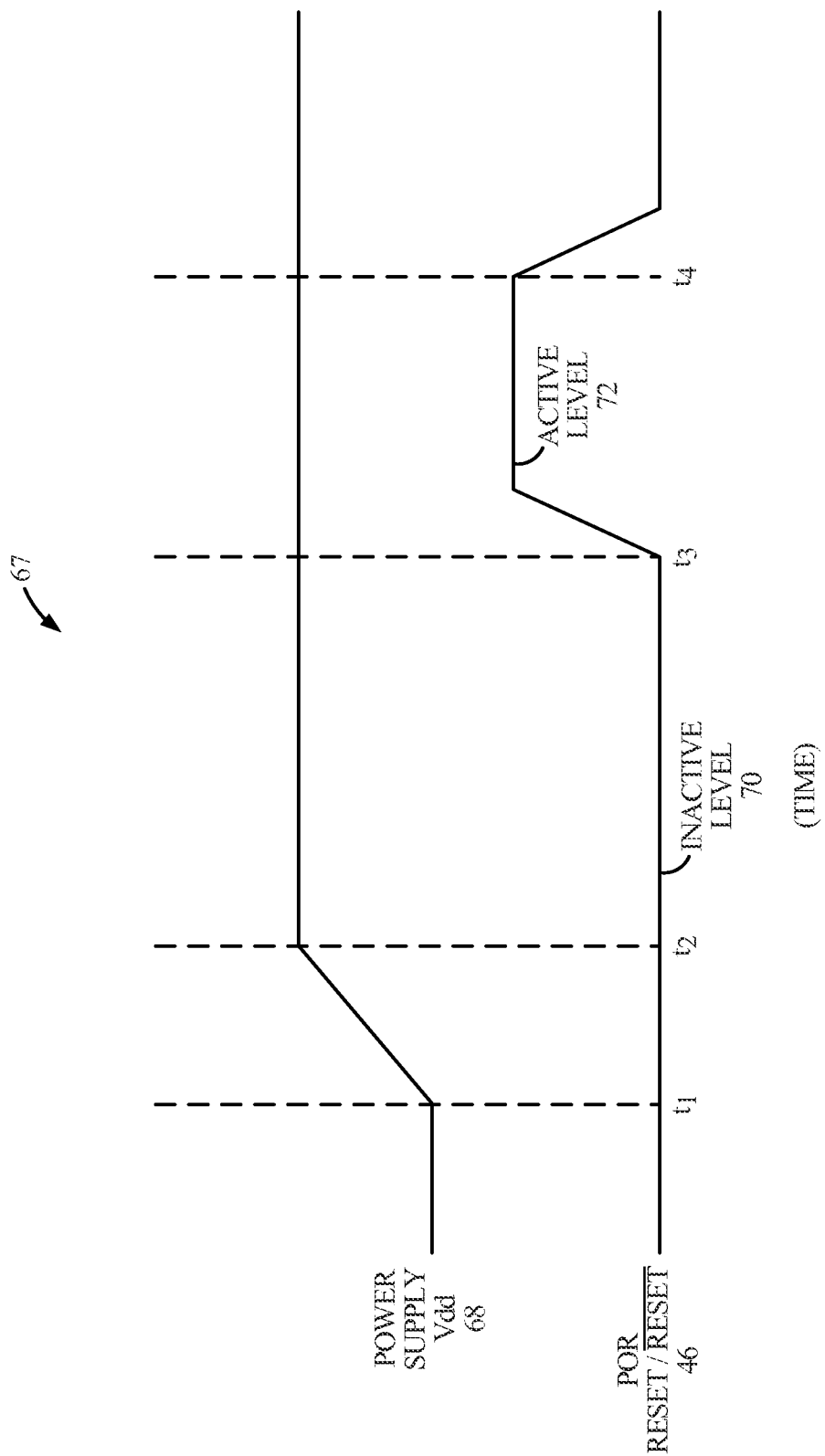
FIG. 4 is a block diagram illustrating a POR reset signal becoming active at a predetermined time after a power supply voltage (Vdd) has stabilized.

The POR reset time delay 62 ($\tau$) may provide the POR reset 46 with a predetermined time after the power supply voltage (Vdd) of the memory system 42 has stabilized. In this regard, FIG. 4 illustrates a timing diagram 67 illustrating a power supply voltage (Vdd) 68 which begins ramping up at time t1 when the memory system 42 is powered on. The power supply voltage (Vdd) 68 completes ramping up at time t2. As illustrated in FIG. 4, the POR reset 46 is initially inactive when the memory system 42 is first powered on. However, a predetermined time after the power supply voltage (Vdd) 68 ramps up to a stable voltage (i.e., an inactive level 70) the POR reset 46 ramps up to an active level 72. Thus, the predetermined time at which the POR reset 46 activates after the power supply voltage (Vdd) 68 ramps up to a stable voltage is illustrated by the difference of t3 minus t2 in FIG. 4. The POR reset 46 thereafter returns to an inactive level 70 beginning at time t4.

Figure 5:
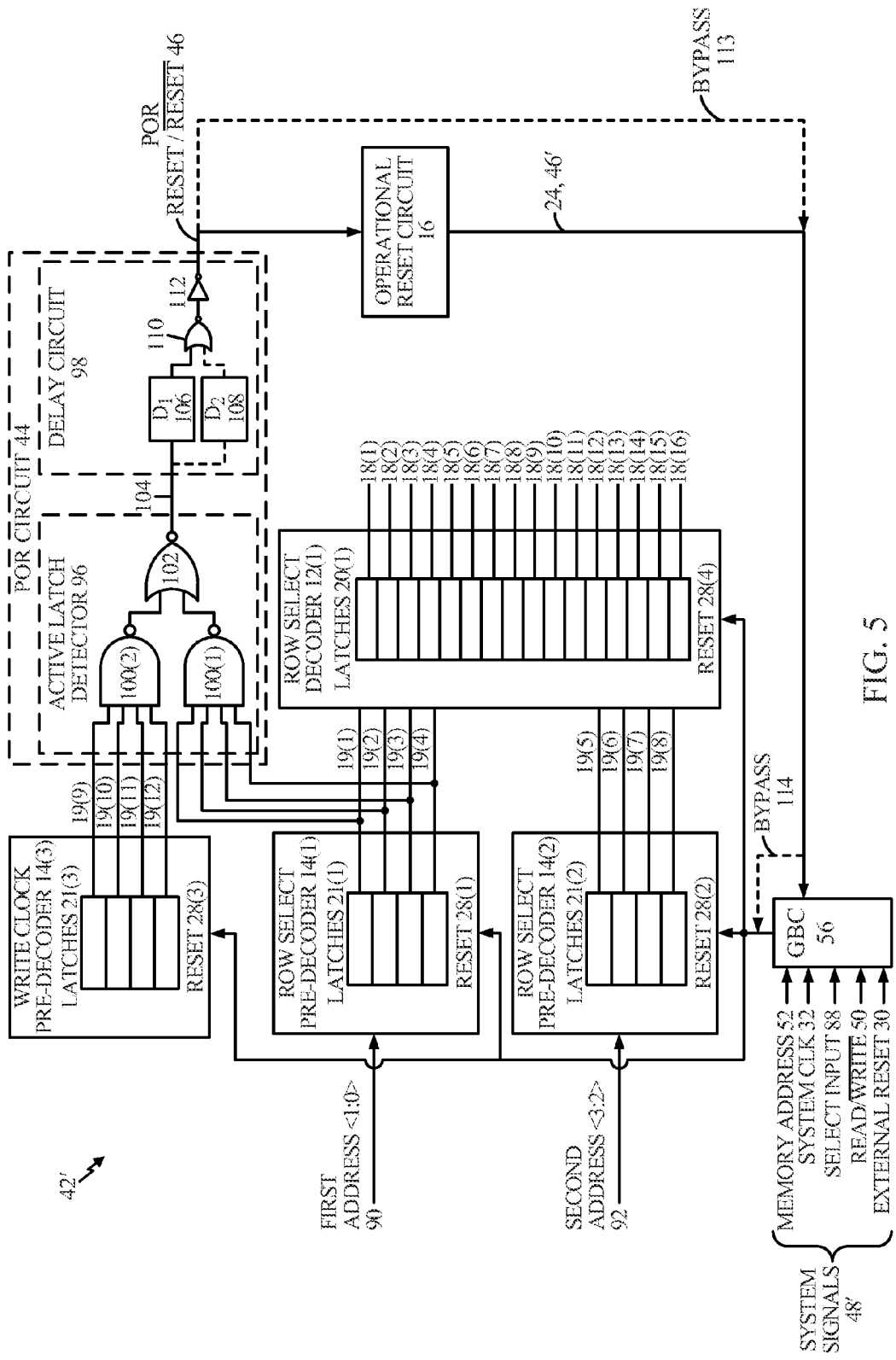
FIG. 5 is a circuit diagram of an exemplary memory system comprising a POR circuit configured to receive a plurality of decoded address outputs from a memory decoding device(s) and generates a POR reset if any of the plurality of decoded address outputs are active.

FIG. 5 illustrates another exemplary memory system comprising a POR circuit 44. In this regard, FIG. 5 illustrates a memory system 42'. The memory system 42' comprises a GBC 56 receiving system signals 48' including a select input 88 for enabling the GBC 56. The memory system 42' also comprises several memory pre-decoding devices 14. A memory pre-decoding device 14 may comprise a row/select pre-decoder, a write clock pre-decoder, and/or another memory address pre-decoder. In this regard, the memory system 42' comprises a row select pre-decoder 14(1) and a row select pre-decoder 14(2). Also in this regard, the memory system 42' comprises a write clock pre-decoder 14(3). The memory system 42' also comprises a memory decoding device 12. A memory decoding device 12 may comprise a row select decoder, and/or other memory address decoders. In this regard, the memory system 42' comprises a row select decoder 12(1).

The row select pre-decoder 14(1) receives as input a first address portion 90 (address <1:0>) of the memory address 52. The row select pre-decoder 14(2) receives a second address portion 92 (address <3:2>). The first address portion 90 and the second address portion 92 allow the row select pre-decoder 14(1) and the row select pre-decoder 14(2) to pre-decode the memory address 52 to enable and/or power the addressed memory bank 38. The row select pre-decoder 14(1) generates a plurality of decoded address outputs 19(1), 19(2), 19(3), 19(4). The write clock pre-decoder 14(3) generates a plurality of decoded address outputs 19(9)-19(12). The decoded address outputs 19(1)-19(4) and 19(9)-19(12) are received by the POR circuit 44. As illustrated in FIG. 5, the POR circuit 44 may be configured to receive decoded address outputs 19(1)-19(4) from certain memory pre-decoding devices 14(1), and not receive decoded memory address outputs 19(5)-19(8) generated from other memory pre-decoding devices 14(2). However, the decoded address outputs 19(5)-19(8) of the row select pre-decoder 14(2) may also be provided as inputs of the POR circuit 44.

FIG. 5 also illustrates that the POR circuit 44 may receive decoded memory address outputs 19 from different types of memory pre-decoding devices 14. In this regard, the POR circuit 44 also receives decoded address outputs 19(9)-19(12) from a write clock pre-decoder 14(3). FIG. 5 also illustrates that the POR circuit 44 may not receive decoded address outputs 18(1)-18(16) of the memory decoding device 12 (here, a row select decoder 12(1)). However, the POR circuit 44 may also be configured to receive the decoded address outputs 18(1)-18(16) of latches 20(1) of the row select decoder 12(1).

FIG. 5 also illustrates that the POR circuit 44 may be comprised of an active latch detector 96 and a delay circuit 98. The active latch detector 96 receives a plurality of decoded address outputs 19 (more specifically, 19(1)-19(4) and 19(9)-19(12)). The active latch detector 96 may comprise AND-based logic 100 (such as, AND-based logic 100(1), 100(2)). The decoded address outputs 19(1)-19(4) and 19(9)-19(12) are active low. In this regard in FIG. 5, the AND-based logic 100(1), 100(2) is provided via NAND-gates and then provided to a NOR-gate 102 to provide an active latch indication 104. However, one of ordinary skill in the art will appreciate that alternative logic may be used in the active latch detector 96 to accommodate active high decoded address outputs 19(1)-19(4) and 19(9)-19(12).

The active latch indication 104 indicates if any of the plurality of decoded address outputs 19(1)-19(4) and 19(9)-19(12) are active. The active latch indication 104 is received by the delay circuit 98 of the POR circuit 44. The delay circuit 98 delays the active latch indication 104 by a first predetermined delay (D1) 106 to provide the POR reset 46. When the delay circuit 98 delays the active latch indication 104 by only the first delay 106, the first delay 106 may also comprise the delay caused by a NOR-gate 110 and an inverter 112. Alternatively, the first delay 106 may be provided directly as the POR reset 46 without being provided through the NOR-gate 110 and the inverter 112.

The POR circuit 44 may delay the setting of the POR reset 46 by a different amount of time than the resetting of the POR reset 46. In this regard, the delay circuit 98 may delay the setting (i.e. activation) of the POR reset 46 to an active level 72 by the first predetermined delay (D1) 106 and delay the resetting (i.e., deactivation) of the POR reset 46 by a second delay (D2) 108. The delay circuit 98 may be provided to use the first predetermined delay 106 for the setting (i.e., making active) of the POR reset 46 and the second predetermined delay 108 for resetting (i.e., making inactive) such that the second predetermined delay 108 is greater than the first predetermined delay 106. This allows the delay circuit 98 to have a greater delay for setting (i.e., making active the POR reset 46) than for resetting (i.e., making inactive) the POR reset 46.

After power-on and before operational mode has begun, the POR circuit 44 will provide the POR reset 46 to the memory pre-decoding devices 14 and/or the memory decoding devices 12. However, the POR circuit 44 may continue to operate during operational mode of the memory system 42'. Therefore it may be advantageous/desirable for the second predetermined delay 108 delaying the POR reset 46 to be delayed by the second delay (D2) 108 greater than the delay required for resetting the memory pre-decoding devices 14 and/or the memory decoding devices 12 by the operational reset circuit 16 when in operational mode. However, the resetting of the POR reset 46 should have a shorter delay in order to avoid delaying the reset of the POR reset 46 (i.e., making the POR reset 46 inactive) beyond a current clock cycle in operational mode.

As also illustrated in FIG. 5, the POR reset 46 generated by the POR circuit 44 may be provided to the operational reset circuit 16. As a result, the operational reset circuit 16 may provide a POR reset 46' based on the POR reset 46, in order to reset the memory pre-decoding devices 14 and/or the memory decoding device 12. It may be advantageous to provide the POR reset 46 of the POR circuit 44 to the operational reset circuit 16 in this manner in order to reuse the portions of the operational reset circuit 16 to generate a POR reset 46'. In this manner, portions of the operation reset circuit 16 that that are already capable of generating an operational reset 24 may also be used to generate a POR reset 46'. The POR reset 46' may be transmitted to the memory pre-decoding devices 14 and/or the memory decoding devices 12 in response to receiving the POR reset 46. Alternatively, as illustrated by bypass 113 in FIG. 5, the POR reset 46 may bypass the operational reset circuit 16. Regardless, the POR reset 46, 46' may be provided to the GBC 56 to provide the POR reset 46, 46' to the memory pre-decoding devices 14 and/or the memory decoding devices 12. Alternatively, as illustrated by bypass 114 in FIG. 5, the POR reset 46, 46' may be directly provided to the memory pre-decoding devices 14 and/or the memory decoding devices 12. It may be desirable to have a greater second delay 108 for resetting the POR reset 46 to allow the POR circuit 44 to determine whether another component of the memory system 42' will first reset the memory pre-decoding devices 14 and/or the memory decoding devices 12.

Figure 6:
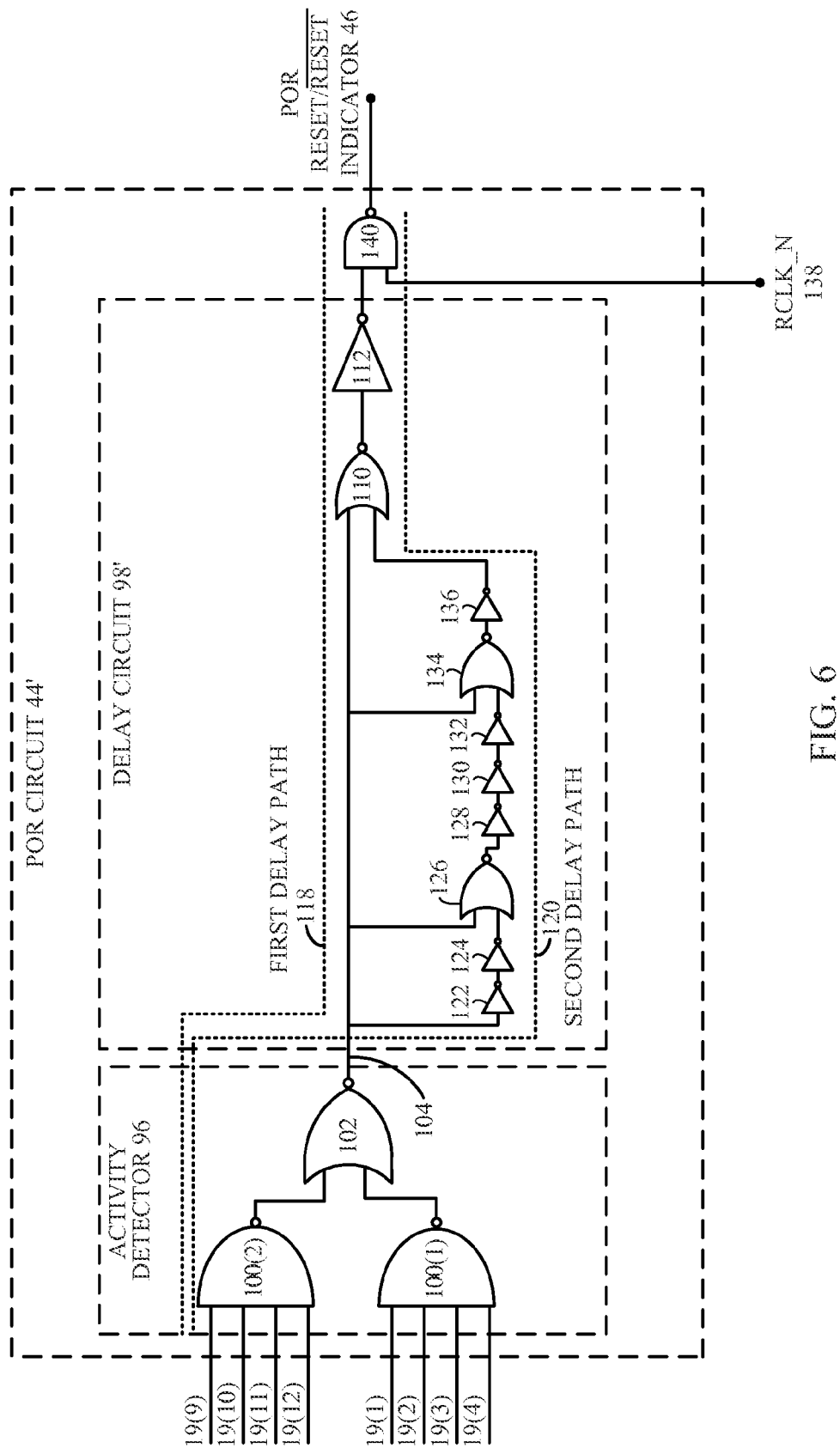
FIG. 6 is a circuit diagram of an exemplary POR circuit configured to receive a plurality of decoded address outputs from a memory decoding device(s) and generates a POR reset if any of the plurality of decoded address outputs are active.

FIG. 6 illustrates another exemplary embodiment of the POR circuit 44. In this regard, FIG. 6 depicts a POR circuit 44' comprising an activity detector 96 and a delay circuit 98'. The POR circuit 44' depicts a first delay path 118 and a second delay path 120. The decoded address outputs 19(1)-19(4) and 19(9)-19(12) are active low. The first delay path 118 is comprised of the gate delays distributed by AND-based logic gates 100 (here, 100(1), 100(2)), NOR-gate 102, NOR-gate 110, inverter 112, and NAND-gate 140. The second delay path 120 comprises a second delay which is the sum of the gate delays 100 (here, 100(1)), NOR-gate 102, inverter 122, inverter 124, NOR-gate 126, inverter 128, inverter 130, inverter 132, NOR-gate 134, inverter 136, NOR-gate 110, inverter 112, and NAND-gate 140. Inverters, NOR-gates, and/or other gates may be provided in the second delay path 120 to tune the specific delay contributed by the sum of the gate delays of the gates. Inverters, NOR-gates, and/or other logic gates may also be used in the second delay path 120 to tune and/or adjust the delay of the second path 120 as desired.

In FIG. 6, the second delay path 120 has a greater delay than the delay of the first delay path 118. This allows the setting of the POR reset 46 to be delayed by the greater delay of the second delay path 120 and the resetting of the POR reset 46 to be delayed by the shorter delay of the first delay path 118. In this regard, the POR circuit 44' is slower to respond to a setting of the POR reset 46 and faster to respond to a reset of the POR reset 46. When operating in operational mode, this allows the POR reset 46 generated by the POR circuit 44' to be canceled while the delay set is traversing the second delay path 120 because a reset by the operational reset circuit 16 would deactivate all the decoded address inputs 19(1)-19(4) and 19(9)-19(12) and provide an active latch indication 104 to NOR-gate 110 before the prior active latch indication 104 traversing the logic gates 122-136 of the second delay path 120 reach the NOR-gate 110. Because the reset decoded address outputs 19(1)-19(4) and 19(9)-19(12) reset by the operational reset circuit 16 are now causing the active latch indication 104 to provide an inactive indication directly to the NOR-gate 110, the previously indicated active latch indication 104 traversing the logic gates 122-136 will be canceled upon reaching the NOR-gate 110. In this manner, the POR circuit 44' is able to cancel the POR reset 46 when the POR reset 46 is generated by the POR circuit 44' and when the POR reset 46 is being provided by the operational reset circuit 16. This allows the POR circuit 44' to avoid causing an unnecessary reset of the decoded address outputs 18, 19.

The AND-based logic 140 depicted in FIG. 6 is optional. When provided, the AND-based logic 140 receives a POR reset masking input (RCLK_N) 138. The RCLK_N 138 illustrated in FIG. 6 is an active low input. RCLK_N may be used to prevent (i.e., mask) or allow (i.e., make transparent) the POR reset 46 from being generated by the POR circuit 44'. If RCLK_N is active (e.g., 0), an active POR reset 46 cannot be generated from the POR circuit 44'. If RCLK_N is inactive (e.g., 1), an active POR reset 46 may be generated from the POR circuit 44'.

Referring now back to FIG. 5, in an embodiment in which the operational reset circuit 16 is used to provide a POR reset 46' based on the POR reset 46, RCLK_N may be made active whenever the operational reset circuit 16 has been triggered to generate an operational reset 24. In this manner, generation of an active POR reset 46 may be masked out (i.e. prevented) while the operational reset circuit 16 is generating an active operational reset 24. This is advantageous so that the POR circuit 44' will not reset the memory pre-decoding devices 14 and/or the memory decoding devices 12 while the operational reset 24 is being generated. RCLK_N may be provided by a latch 20 output used to trigger the operational reset circuit 16. That latch 20 output may also be provided as an input to the AND-based logic gates 100 of the POR circuit 44'.

In an embodiment in which the POR reset 46 bypasses the operational reset circuit 16 (for example using bypass 113 of FIG. 5), the AND-based logic 140 and the RCLK_N 138 in FIG. 6 may not need to be provided. In that case, the output of the inverter 112 may be directly provided as the POR reset 46.

The POR circuit 44' illustrated in FIG. 6 is a self-timed circuit. In this regard, the activity detector 96 and the delay circuit 98' are not based on the system clock 22 but are instead based on the decoded address outputs 19 (and/or 18) and other internal logic of the POR circuit 44'. The RCLK_N 138 allows the POR reset 46 to be transparently provided or masked but the POR circuit 44' is still self-timed. However, the POR reset 46 provided to the memory pre-decoding devices 14 and/or the memory decoding devices 12 may also be based on the system clock 22.

Figure 7:
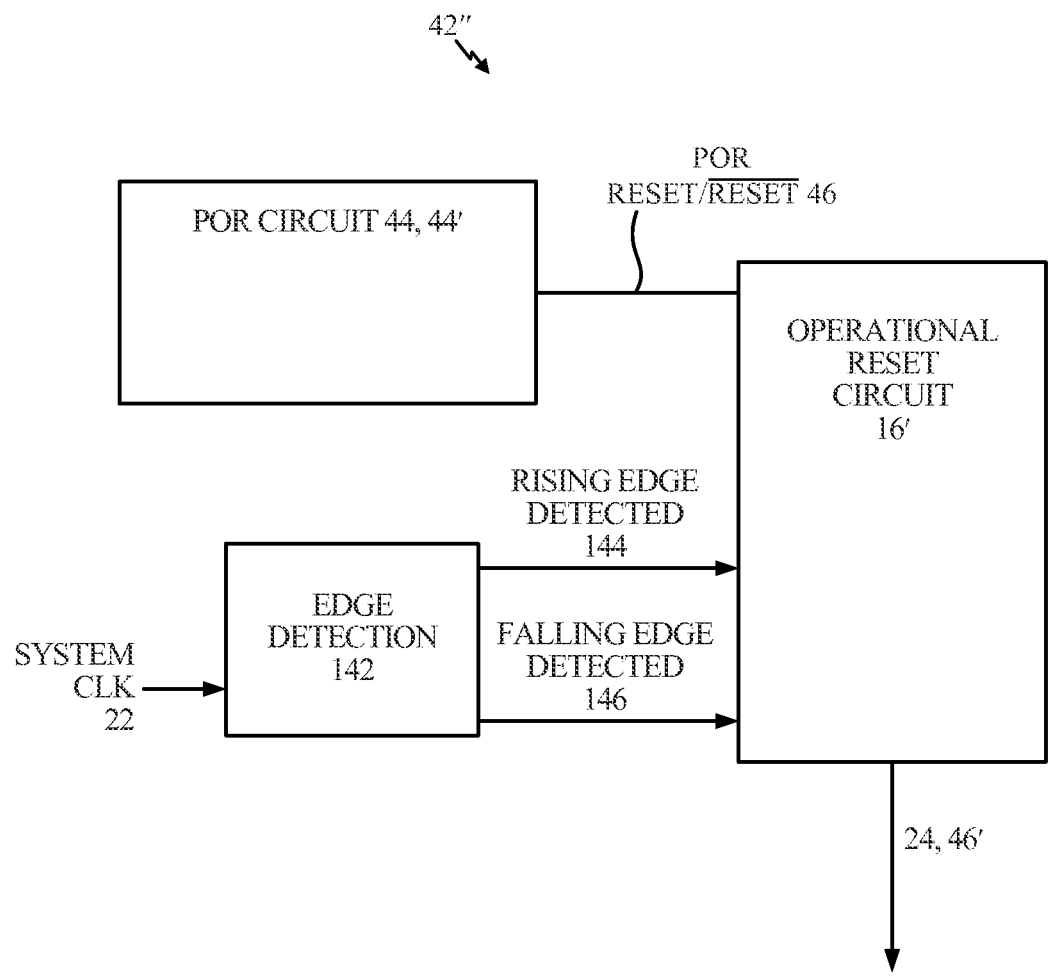
FIG. 7 is a circuit diagram illustrating a POR reset signal generated based on a POR circuit and a rising and/or falling edge of a clock.

In this regard, FIG. 7 illustrates a memory system 42" providing a POR reset 46' based on the POR reset 46 generated by the POR circuit 44, 44' and edge detection 142 of the system clock 22. The operational reset circuit 16' may delay the POR reset indicator 46 provided by the POR circuit 44, 44' until the rising edge of the system clock 22 is detected 144 and/or the falling edge of the system clock 22 is detected 146.

In this regard, the memory system 42" comprises edge detection logic 142 receiving the system clock 22 and generating a rising edge clock detection indicator 144 and/or a falling edge clock detection indicator 146. The rising edge clock detection indicator 144 and/or the falling edge detection indicator 146 are received by the operational reset circuit 16'. The operational reset circuit 16' thereby delays the POR reset indicator 46 received from the POR circuit 44, 44' until the rising edge and/or the falling edge of the system clock 22 is detected by the edge detection 142. Upon detecting the rising edge indication 144 and/or the falling edge indication 146, the operational reset circuit 16' generates the POR reset indicator 46' for resetting the memory pre-decoding devices 14 and/or the memory decoding devices 12.

In this regard, FIG. 8A illustrates a timing diagram 148. The timing diagram 148 illustrates the system clock 22 and a falling edge 150 of the system clock 22. A memory operation may generally begin on a rising edge 152 of the system clock 22 and finish on the falling edge 150 of the system clock 22. In order to avoid resetting latches 20, 21 of the memory pre-decoding device(s) 14 and/or memory decoding device(s) 12 during a memory operation, the POR reset may be provided in response to the falling edge 150 of the system clock 22. In this regard, as illustrated in FIG. 8A, the POR reset indicator 46' may be generated in response to the falling edge 150 of the system clock 22 as a reset indication pulse 154.

Alternatively, the latches 20, 21 may be reset at the very beginning of a memory operation. In this regard, as illustrated in FIG. 8B, the POR reset indicator 46' may alternatively be generated based on the rising edge 152 of the system clock 22. As illustrated in FIG. 8B, the POR reset 46' is generated in response to the rising edge 152 of the system clock 22 to provide a reset indication pulse 156 for resetting the memory pre-decoding devices 14 and/or the memory decoding devices 12 of the memory system 42, 42', 42".

The internally-generated power-on-reset (POR) circuits 44, 44' for resetting memory decoding devices 12 and/or memory pre-decoding devices 14 (and their corresponding latches 20, 21), and related circuits, systems, and methods according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player into which the POR circuit 44, 44' may be integrated.

Figure 9:
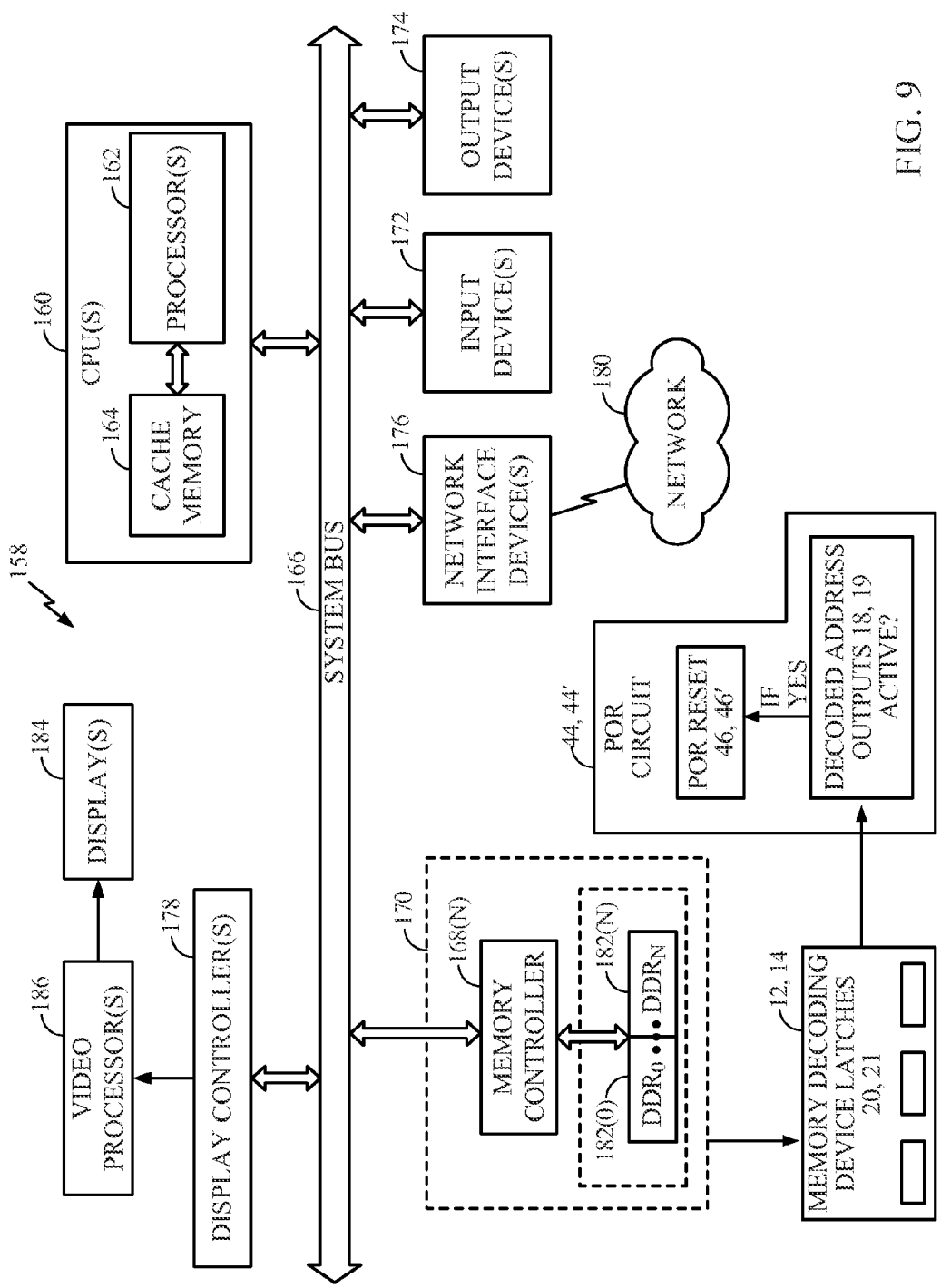
FIG. 9 is a block diagram of an exemplary processor-based system including a POR circuit according to embodiments disclosed herein.

In this regard, FIG. 9 illustrates an example of a processor-based system 158 that can employ the POR circuit 44 and system 42 illustrated in FIGS. 2 and 3. In this example, the processor-based system 158 includes one or more central processing units (CPUs) 160, each including one or more processors 162. The CPU(s) 160 may have cache memory 164 coupled to the processor(s) 162 for rapid access to temporarily stored data. The CPU(s) 160 is coupled to a system bus 166 and can intercouple master devices and slave devices included in the processor-based system 158. The POR circuit 44 is independent of the system bus 166. As is well known, the CPU(s) 160 communicates with these other devices by exchanging address, control, and data information over the system bus 166. For example, the CPU(s) 160 can communicate bus transaction requests to the memory controller 168(N)

as an example of a slave device. Although not illustrated in FIG. 9, multiple system buses 166 could be provided, wherein each system bus 166 constitutes a different fabric.

Other master and slave devices can be connected to the system bus 166. As illustrated in FIG. 9, these devices can include a memory system 170, one or more input devices 172, one or more output devices 174, one or more network interface devices 176, and one or more display controllers 178, as examples. The input device(s) 172 can include any type of input device, including but not limited to input keys, switches, voice processors, etc. The output device(s) 174 can include any type of output device, including but not limited to audio, video, other visual indicators, etc. The network interface device(s) 176 can be any devices configured to allow exchange of data to and from a network 180. The network 180 can be any type of network, including but not limited to a wired or wireless network, private or public network, a local area network (LAN), a wide local area network (WLAN), and the Internet. The network interface device(s) 176 can be configured to support any type of communication protocol desired. The memory system 170 can include one or more memory units 182(O-N). The POR reset 46, 46' may be provided in the POR circuit 44, 44' if the plurality of memory decoder latches 20, 21 provides decoded address outputs 18, 19 that are active (as non-limiting examples, active-low and/or active-high).

The CPU 160 may also be configured to access the display controller(s) 178 over the system bus 166 to control information sent to one or more displays 184. The display controller(s) 178 sends information to the display(s) 184 to be displayed via one or more video processors 186, which process the information to be displayed into a format suitable for the display(s) 184. The display(s) 184 can include any type of display, including but not limited to a cathode ray tube (CRT), a liquid crystal display (LCD), a plasma display, etc.

The CPU(s) 160 and the display controller(s) 178 may act as master devices to make memory access requests to the memory system 170 over the system bus 166. Different threads within the CPU(s) 160 and the display controller(s) 178 may make requests to the memory system 170. The CPU(s) 160 and the display controller(s) 178 may provide the plurality of memory decoder latches 20, 21 to the POR circuit 44, 44', as previously described.

Those of skill in the art would further appreciate that the various illustrative logical blocks, modules, circuits, and algorithms described in connection with the embodiments disclosed herein may be implemented as electronic hardware, instructions stored in memory or in another computer-readable medium, including a non-transitory computer-readable medium, and executed by a processor or other processing device, or combinations of both. The arbiters, master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a DSP, an Application Specific Integrated Circuit (ASIC), an FPGA or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A power-on-reset (POR) circuit for resetting at least one memory decoding device as a result of a power-on condition, the POR circuit configured to:
   receive as input, a plurality of decoded address outputs from at least one memory decoding device; and
   generate a POR reset if any of the plurality of decoded address outputs are active.

2. The POR circuit of claim 1, wherein the at least one memory decoding device is comprised of at least one memory decoding latch or at least one memory pre-decoding latch.

3. The POR circuit of claim 1, wherein the at least one memory decoding device is comprised of at least one pulsed latch.

4. The POR circuit of claim 1, further comprising an activity detector configured to:
receive as input, the plurality of decoded address outputs from the at least one memory decoding device;
determine from the plurality of decoded address outputs if any of the plurality of decoded address outputs are active; and
generate an activity indication indicating if any of the plurality of decoded address outputs are active.

5. The POR circuit of claim 1, further comprising a delay circuit configured to:
receive the activity indication; and
generate the POR reset after a first predetermined delay if the activity indication indicates that any of the plurality of decoded address outputs are active.

6. The POR circuit of claim 5, wherein the delay circuit is further configured to cease generating the POR reset after a second predetermined delay if the activity indication indicates that all of the plurality of decoded address outputs are inactive.

7. The POR circuit of claim 5, wherein the first predetermined delay is greater than the second predetermined delay.

8. The POR circuit of claim 1 integrated into a semiconductor die.

9. The POR circuit of claim 1, further comprising a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player, into which the POR circuit is integrated.

10. A means for resetting a memory decoding device as a result of a power-on condition, comprising:
a means for receiving as input, a plurality of decoded address outputs from at least one memory decoding device; and
a means for generating a power-on-reset (POR) reset if any of the plurality of decoded address outputs are active.

11. A method of resetting a memory decoding device as a result of a power-on condition, comprising:
receiving as input, a plurality of decoded address outputs from at least one memory decoding device; and
generating a power-on-reset (POR) reset if any of the plurality of decoded address outputs are active.

12. The method of claim 11, further comprising:
determining from the plurality of decoded address outputs if any of the plurality of decoded address outputs are active; and
generating an activity indication indicating if any of the plurality of decoded address outputs are active.

13. The method of claim 11, further comprising generating the POR reset after a first predetermined delay if an activity indication indicates that any of the plurality of decoded address outputs are active.

14. The method of claim 13, further comprising ceasing generating the POR reset after a second predetermined delay if the activity indication indicates that all of the plurality of decoded address outputs are inactive.

15. The POR circuit of claim 14, wherein a first predetermined delay is greater than the second predetermined delay.

16. A memory system, comprising:
at least one memory decoding device configured to:
store at least a portion of a memory address;
generate a plurality of decoded address outputs from a plurality of memory decoding device latches; and
receive a reset input to reset all of the plurality of decoded address outputs to an inactive state; and
a power-on-reset (POR) circuit configured to:
receive as input, the plurality of decoded address outputs from the plurality of memory decoding device latches; and
generate a POR reset to provide the reset input if any of the plurality of decoded address outputs are active.

17. The memory system of claim 16, wherein the at least one memory decoding device is further configured to receive the POR reset as the reset input.

18. The memory system of claim 16, wherein the at least one memory decoding device is further configured to receive a reset indication based on the POR reset as the reset input.

19. The memory system of claim 18, wherein the at least one memory decoding device is further configured to reset the plurality of memory decoding device latches upon receiving the POR reset.

20. The memory system of claim 16, further comprising an external reset.

21. The memory system of claim 16, further comprising an operational reset circuit configured to:
detect at least one operational reset condition; and
reset one of the plurality of memory decoding device in response to the at least one operational reset condition.

22. The memory system of claim 21, wherein the generating of the POR reset is not based on the at least one operational reset condition.

23. The memory system of claim 16, wherein the generated POR reset is canceled upon detecting completion of an operating mode operation.

24. The memory system of claim 16, further comprising a global bank control (GBC) configured to:
receive the POR reset; and
provide the reset input in response to receiving the POR reset.

25. The memory system of claim 16, further comprising a row select decoding device configured to:
receive the plurality of decoded address outputs; and
generate a row select indication based on the plurality of decoded address outputs.

26. The memory system of claim 16, wherein the POR circuit further comprises an activity detector configured to:
receive as input, the plurality of decoded address outputs from the at least one memory decoding device;
determine from the plurality of decoded address outputs if any of the plurality of decoded address outputs are active; and
generate an activity indication indicating if any of the plurality of decoded address outputs are active.

27. The memory system of claim 16, wherein the reset input is provided in response to a rising edge of a clock signal.

28. The memory system of claim 16, wherein the reset input is provided in response to a falling edge of a clock signal.

29. A non-transitory computer-readable medium having stored thereon computer-executable instructions to cause a processor to implement a method for resetting a memory decoding device as a result of a power-on condition, comprising:
    receiving as input, a plurality of decoded address outputs from at least one memory decoding device; and
    generating a power-on-reset (POR) reset if any of the plurality of decoded address outputs are active.

\* \* \* \* \*